(12) United States Patent
Kim et al.

(10) Patent No.: US 12,568,623 B2
(45) Date of Patent: Mar. 3, 2026

(54) MANUFACTURING METHOD OF SEMICONDUCTOR DEVICE

(71) Applicant: SK hynix Inc., Icheon-si (KR)

(72) Inventors: Jong Gi Kim, Icheon-si (KR); Young Jin Noh, Icheon-si (KR); Jae O Park, Icheon-si (KR); Jin Ho Bin, Icheon-si (KR); Dong Chul Yoo, Icheon-si (KR); Yoo Il Jeon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 509 days.

(21) Appl. No.: 18/187,609

(22) Filed: Mar. 21, 2023

(65) Prior Publication Data

US 2024/0121955 A1 Apr. 11, 2024

(30) Foreign Application Priority Data

Oct. 7, 2022 (KR) ........................ 10-2022-0128310

(51) Int. Cl.
| | |
|---|---|
| *H10B 43/27* | (2023.01) |
| *H10B 41/10* | (2023.01) |
| *H10B 41/27* | (2023.01) |
| *H10B 43/10* | (2023.01) |

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
CPC ................................ H10B 43/27; H10B 43/20
See application file for complete search history.

(56) References Cited

U.S. PATENT DOCUMENTS

| | | | |
|---|---|---|---|
| 11,121,152 B2 | 9/2021 | Wang et al. | |
| 2009/0227116 A1* | 9/2009 | Joo ........................ | H10D 30/69 438/763 |
| 2022/0254806 A1* | 8/2022 | Seo ..................... | H01L 21/0214 |

FOREIGN PATENT DOCUMENTS

KR 1020200141257 A 12/2020

* cited by examiner

*Primary Examiner* — Christopher A Johnson
(74) *Attorney, Agent, or Firm* — WILLIAM PARK AND ASSOCIATES LTD.

(57) ABSTRACT

A manufacturing method of a semiconductor device may include: forming a stack comprising first material layers and second material layers that are alternately stacked; forming an opening in the stack; forming a first seed layer in the opening; forming a first buffer layer by surface-treating the first seed layer; and forming a blocking layer by oxidizing the first seed layer through the first buffer layer.

16 Claims, 15 Drawing Sheets

MANUFACTURING METHOD OF SEMICONDUCTOR DEVICE

CROSS-REFERENCE TO RELATED APPLICATION

This application claims priority under 35 U.S.C. § 119(a) to Korean Patent Application No. 10-2022-0128310 filed on Oct. 7, 2022, in the Korean Intellectual Property Office, which is incorporated herein by reference in its entirety.

BACKGROUND

1. Technical Field

Embodiments of the present disclosure relate to an electronic device, and more particularly, to a semiconductor device and a manufacturing method thereof.

2. Related Art

The degree of integration of a semiconductor device is mainly determined by an area occupied by a unit memory cell. Recently, as the improvement in the degree of integration of a semiconductor device for forming memory cells in a single layer on a substrate reaches a limit, a three-dimensional semiconductor device for stacking memory cells on a substrate has been proposed. Furthermore, in order to improve the operational reliability of such a semiconductor device, various structures and manufacturing methods have been developed.

SUMMARY

In an embodiment, a manufacturing method of a semiconductor device may include: forming a stack comprising first material layers and second material layers that are alternately stacked; forming an opening in the stack; forming a first seed layer in the opening; forming a first buffer layer by surface-treating the first seed layer; and forming a blocking layer by oxidizing the first seed layer through the first buffer layer.

In an embodiment, a manufacturing method of a semiconductor device may include: forming a stack comprising first material layers and second material layers that are alternately stacked; forming an opening in the stack; forming a silicon oxynitride layer in the opening; forming a first oxide layer by surface-treating the silicon oxynitride layer; forming a second oxide layer by oxidizing the silicon oxynitride layer through the first oxide layer; and forming a channel layer in the second oxide layer.

DETAILED DESCRIPTION

Various embodiments are directed to a semiconductor device having a stable structure and improved characteristics and a manufacturing method thereof.

By stacking memory cells in three dimensions, it is possible to improve the degree of integration of a semiconductor device. Furthermore, it is possible to provide a semiconductor device having a stable structure and improved reliability.

Hereafter, embodiments in accordance with the technical spirit of the present disclosure will be described with reference to the accompanying drawings.

Figure 1A:
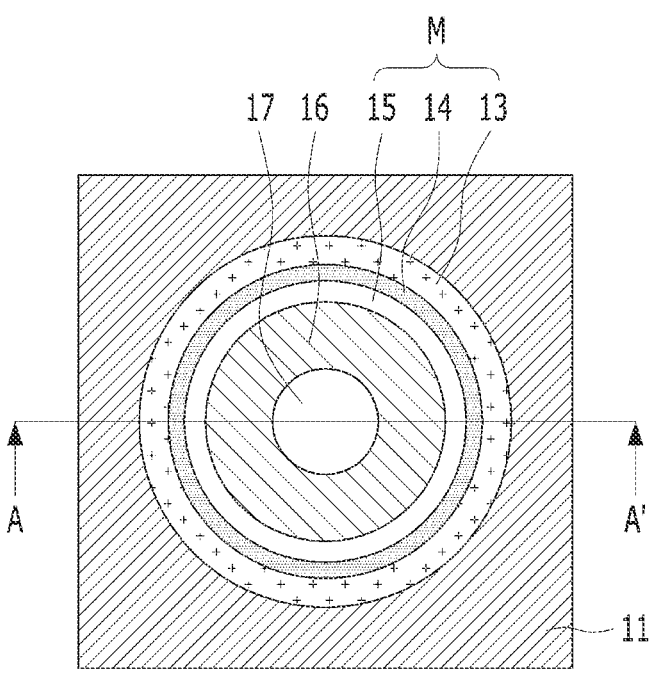
FIG. 1A and FIG. 1B are diagrams illustrating the structure of a semiconductor device in accordance with an embodiment.
Figure 1B:
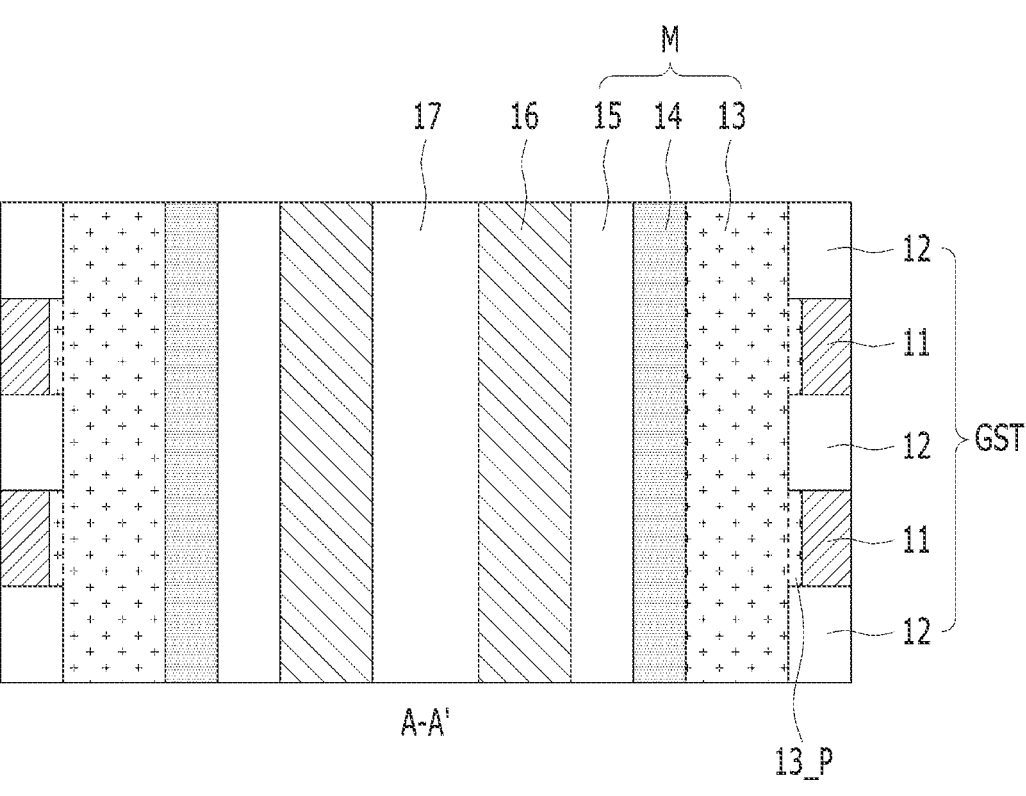

FIG. 1A and FIG. 1B are diagrams illustrating the structure of a semiconductor device in accordance with an embodiment. FIG. 1A may be a plan view and FIG. 1B may be a cross-sectional view taken along line A-A' in FIG. 1A.

Referring to FIG. 1A and FIG. 1B, the semiconductor device may include a gate structure GST and a memory layer M. The semiconductor device may further include a channel layer 16 or an insulating core 17, or a combination thereof.

The gate structure GST may be located on a lower structure, such as a source structure and a peripheral circuit. The gate structure GST may include conductive layers 11 and insulating layers 12 that are alternately stacked. The conductive layers 11 may be a word line, a bit line, or a select line. The conductive layers 11 may each include a conductive material, such as polysilicon, tungsten, or molybdenum. The insulating layers 12 may each include an insulating material, such as oxide, nitride, or an air gap.

The channel layer 16 may be located in the gate structure GST. The channel layer 16 may pass through the gate structure GST in the stacking direction of the conductive layers 11. The channel layer 16 may include a semiconductor material, such as silicon (Si) or germanium (Ge). A memory cell, a select transistor, or the like may be located in an area where the channel layer 16 and the conductive layers 11 cross each other. For reference, the semiconductor device may also include a vertical electrode instead of the channel layer 16.

The memory layer M may be located between the channel layer 16 and the gate structure GST. The memory layer M may include a blocking layer 13, a data storage layer 14, or a tunneling layer 15, or a combination thereof. In an embodiment, the tunneling layer 15, the data storage layer 14, and the blocking layer 13 may sequentially surround a sidewall of the channel layer 16.

The blocking layer 13 may include at least one protrusion 13_P on an outer wall or an inner wall thereof. The protrusions 13_P may protrude into the gate structure GST. The protrusions 13_P may be located at levels respectively corresponding to the conductive layers 11. In an embodiment, the protrusions 13_P may protrude between the insulating layers 12 to be in contact with the conductive layers 11, respectively. The blocking layer 13 may include an oxide. In an embodiment, the blocking layer 13 may be a layer that is formed by oxidizing silicon oxynitride (SiON) and may include silicon oxide ($SiO_2$).

The data storage layer 14 may be located in the blocking layer 13. The data storage layer 14 may include a floating gate, polysilicon, a charge trap material, nitride, a variable resistance material, or the like, or a combination thereof. The tunneling layer 15 may be located in the data storage layer 14. The tunneling layer 15 may include an oxide. In an embodiment, the tunneling layer 15 may be a layer that is formed by oxidizing silicon oxynitride (SiON) and may include silicon oxide ($SiO_2$).

The insulating core 17 may be located in the channel layer 16. The insulating core 17 may include an insulating material, such as oxide, nitride, or air gap. For reference, the semiconductor device might not include the insulating core 17 and may have a shape in which the channel layer 16 is filled up to a central area.

According to the structure described above, the semiconductor device may include stacked memory cells, and the degree of integration of the semiconductor device may be improved. Furthermore, since the memory cells include the blocking layer 13 that is formed by oxidizing a silicon oxynitride layer or the tunneling layer 15 that is formed by oxidizing a silicon oxynitride layer, operating characteristics of the memory cells may be improved.

Figure 2A:
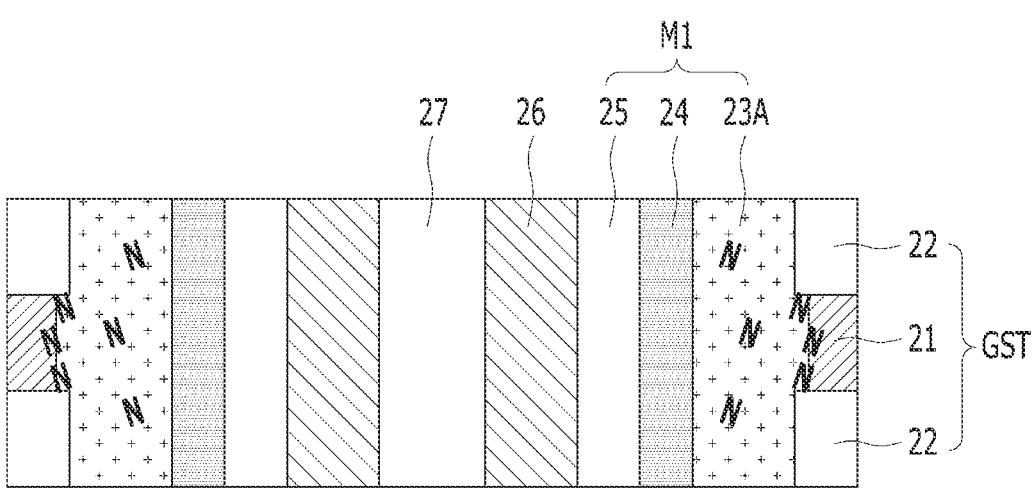
FIG. 2A and FIG. 2B are diagrams illustrating the structure of a semiconductor device in accordance with an embodiment.
Figure 2B:
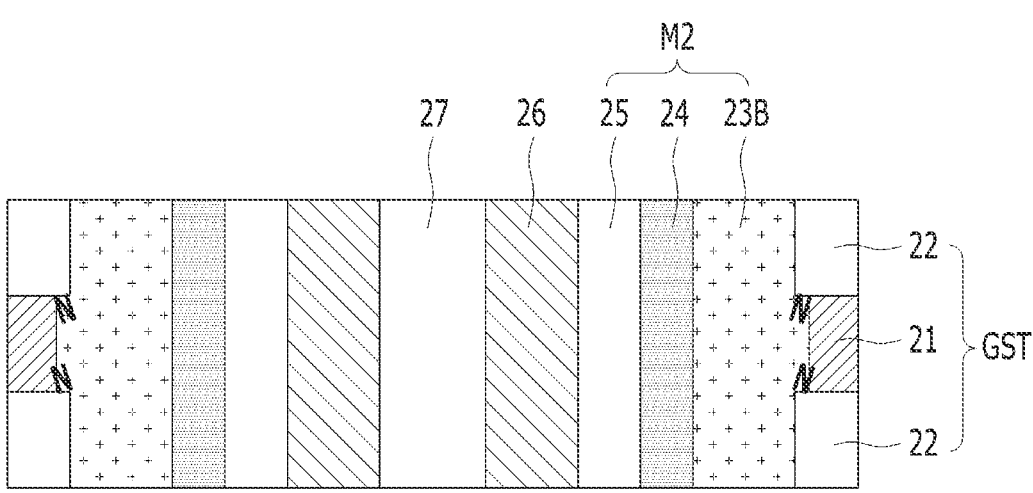

FIG. 2A and FIG. 2B are diagrams illustrating the structure of a semiconductor device in accordance with an embodiment. Hereinafter, the content overlapping with previously described content will be omitted.

Referring to FIG. 2A, the semiconductor device may include a gate structure GST, a first memory layer M1, a channel layer 26, or an insulating core 27, or a combination thereof. The gate structure GST may include conductive layers 21 and insulating layers 22 that are alternately stacked. The first memory layer M1 may include a first blocking layer 23A, a data storage layer 24, or a tunneling layer 25, or a combination thereof.

The first blocking layer 23A may be a silicon oxide layer that is formed by oxidizing a silicon nitride layer. During the oxidation process, nitrogen in the silicon nitride layer may be outgassed in the form of $N_2$ gas, or nitrogen may permeate into the silicon nitride layer. Accordingly, the first blocking layer 23A, which is formed by using a silicon nitride layer having a relatively high nitrogen concentration as a seed layer, may include a relatively large amount of nitrogen-induced trap sites N. The trap sites N may be located in the first blocking layer 23A, at an interface between the first blocking layer 23A and the conductive layer 21, or at an interface between the first blocking layer 23A and the data storage layer 24. The trap sites N may cause charge loss of a memory cell.

Referring to FIG. 2B, the semiconductor device may include a gate structure GST, a second memory layer M2, a channel layer 26, or an insulating core 27, or a combination thereof. The gate structure GST may include conductive layers 21 and insulating layers 22 that are alternately stacked. The second memory layer M2 may include a second blocking layer 23B, a data storage layer 24, or a tunneling layer 25, or a combination thereof. The second blocking layer 23B may be a silicon oxide layer that is formed by oxidizing a silicon oxynitride layer.

The second blocking layer 23B may be a silicon oxide layer that is formed by oxidizing a silicon oxynitride layer. The silicon oxynitride layer may have a lower nitrogen concentration than the silicon nitride layer. Accordingly, the second blocking layer 23B, which is formed by using a silicon oxynitride layer having a relatively low nitrogen concentration as a seed layer, may include a smaller amount of trap sites N than the first blocking layer 23A. Accordingly, charge loss of the memory cell due to the trap sites N may be minimized or prevented.

According to the structure described above, the layer quality of the blocking layers 23A and 23B may vary depending on the physical properties of a seed layer. Although both the first blocking layer 23A and the second blocking layer 23B are silicon oxide layers, the number of trap sites N that are included in the blocking layers 23A and 23B may be reduced by reducing the concentration of nitrogen that are included in the seed layer. Similarly, the number of trap sites N that are included in the tunneling layer 25 may be reduced by reducing the concentration of nitrogen that are included in the seed layer.

Figure 3A:
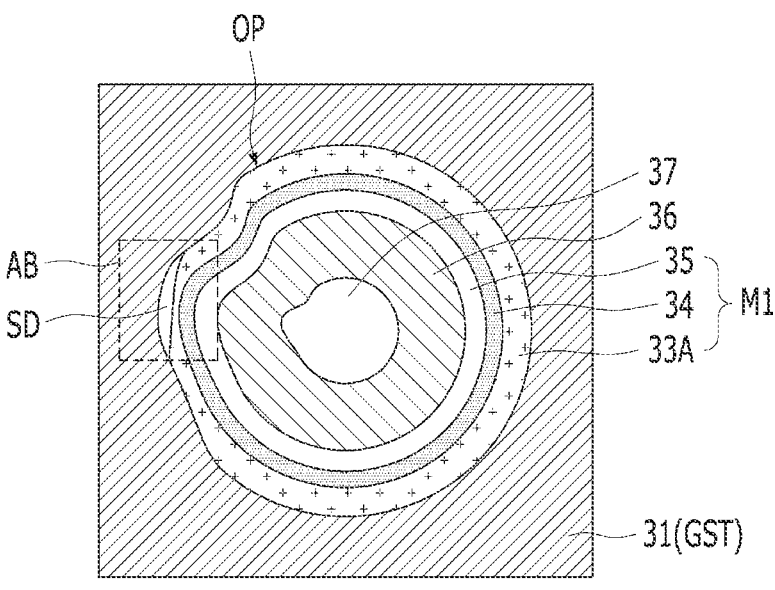
FIG. 3A and FIG. 3B are diagrams illustrating the structure of a semiconductor device in accordance with an embodiment.
Figure 3B:
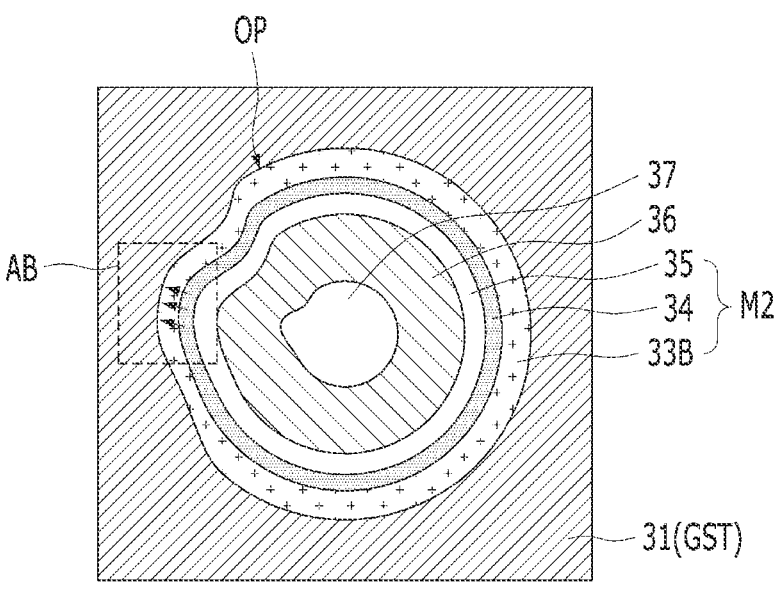

FIG. 3A and FIG. 3B are diagrams illustrating the structure of a semiconductor device in accordance with an embodiment. Hereinafter, the content overlapping with previously described content will be omitted.

Referring to 3A and FIG. 3B, the semiconductor device may include a gate structure GST, memory layers M1 and M2, a channel layer 36, or an insulating core 37. The gate structure GST may include stacked conductive layers 31. A first memory layer M1 may include a first blocking layer 33A, a data storage layer 34, or a tunneling layer 35, or a combination thereof. A second memory layer M2 may include a second blocking layer 33B, a data storage layer 34, or a tunneling layer 35, or a combination thereof.

An opening OP may be located in the gate structure GST. The opening OP may pass through the gate structure GST in the stacking direction of the conductive layers 31. The opening OP may have a shape, such as a circle, an ellipse, or a polygon in plan view. However, due to process limitations or the like, at least a part of the opening OP may have an abnormal profile. The abnormal profile may indicate a shape that is different from the intended shape during an etching process. In an embodiment, in the process of forming the opening OP having a circular shape in plan view, a distorted shape, such as a circular shape having a recessed or protruding part, may be induced. Alternatively, in the process of forming the opening OP by etching layers having different etching rates, a notch may be formed at an interface between the layers.

The memory layers M1 and M2, the channel layer 36, and the insulating core 37 may be located in the opening OP. The first memory layer M1 and the second memory layer M2 may each have a shape corresponding to the opening OP. When the opening OP has an abnormal profile, the first memory layer M1 and the second memory layer M2 may each have an abnormal profile. Similarly, the channel layer 36 or the insulating core 37 may each have an abnormal profile that is transferred from the opening OP.

FIG. 3A and FIG. 3B illustrate a difference between the profiles of the blocking layers 33A and 33B according to a difference in the concentration of nitrogen included in a seed layer. The first blocking layer 33A in FIG. 3A may be formed by oxidizing a first seed layer including nitrogen with a first concentration. The second blocking layer 33B in FIG. 3B may be formed by oxidizing a second seed layer including nitrogen with a second concentration that is different from the first concentration. The second concentration may be lower than the first concentration. In an embodiment, the first seed layer may be a nitride layer, and the second seed layer may be an oxynitride layer.

During the oxidation process, the volume expansion rate of the first seed layer may be greater than that of the second seed layer. Accordingly, a large stress may be induced in the oxidation process of the first seed layer so the first seed layer might not be sufficiently oxidized. Referring to FIG. 3A, the opening OP may include an abnormal protrusion AB due to the abnormal profile, and a non-oxidized first seed layer SD may remain in the abnormal protrusion AB. A trap site may increase due to the remaining first seed layer SD. On the other hand, since the second seed layer has little stress in the oxidation process, the second seed layer may be sufficiently oxidized. Accordingly, the second seed layer might not remain in the abnormal protrusion AB of the opening OP, and the second blocking layer 33B may fill the abnormal protrusion AB.

According to the structure described above, even though the opening OP has an abnormal profile, a seed layer may be sufficiently oxidized by controlling an expansion rate according to the physical properties of the seed layer. Accordingly, the step coverage of the blocking layers 33A and 33B may be improved, and the layer quality of the blocking layers may be improved. Through this, the reliability of the semiconductor device may be improved.

Figure 4A:
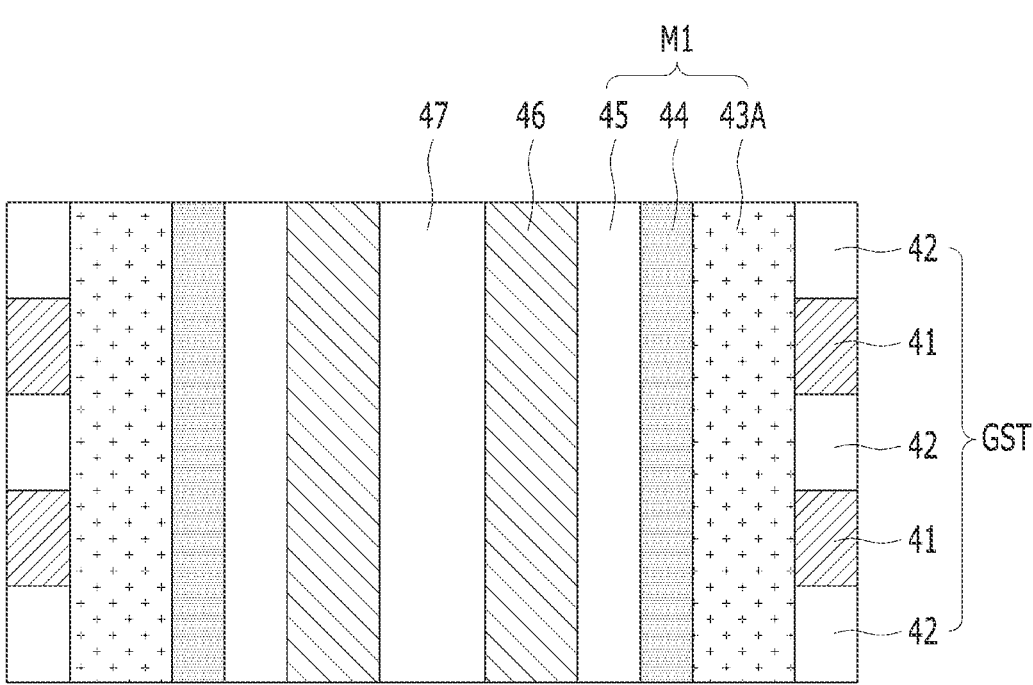
FIG. 4A to FIG. 4C are diagrams illustrating the structure of a semiconductor device in accordance with an embodiment.
Figure 4B:
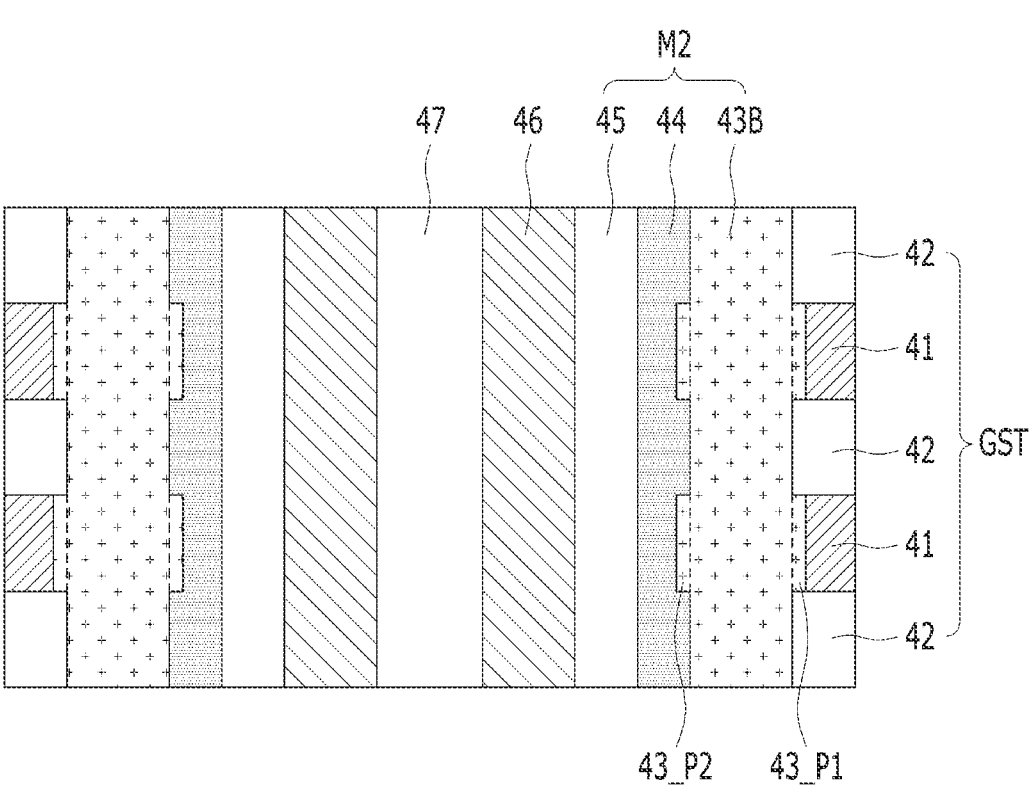
Figure 4C:
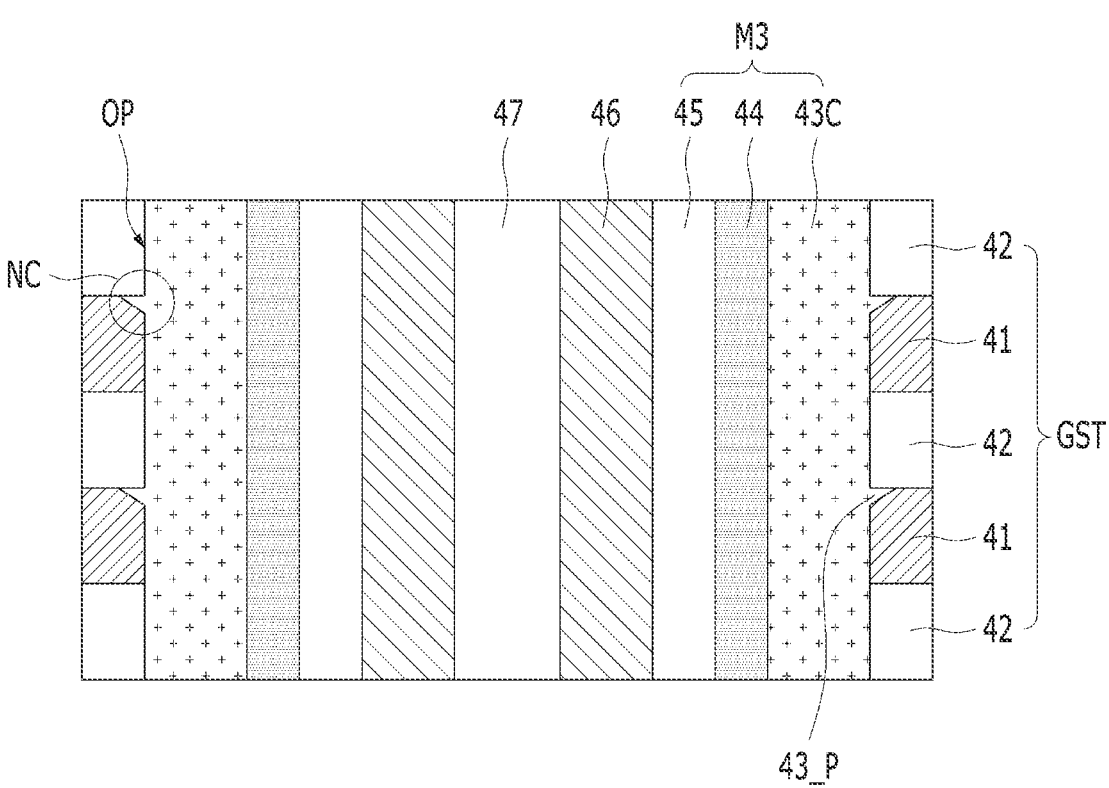

FIG. 4A to FIG. 4C are diagrams illustrating the structure of a semiconductor device in accordance with an embodiment. Hereinafter, the content overlapping with the previously described content will be omitted.

Referring to FIG. 4A to FIG. 4C, the semiconductor device may include a gate structure GST, memory layers M1 to M3, a channel layer 46, or an insulating core 47, or a combination thereof. The gate structure GST may include conductive layers 41 and insulating layers 42 that are alternately stacked. A first memory layer M1 may include a first blocking layer 43A, a data storage layer 44, or a tunneling layer 45, or a combination thereof, a second memory layer M2 may include a second blocking layer 43B, the data storage layer 44, or the tunneling layer 45, or a combination thereof, and a third memory layer M3 may include a third blocking layer 43C, the data storage layer 44, or the tunneling layer 45, or a combination thereof.

Referring to FIG. 4A, the first blocking layer 43A of the first memory layer M1 may include substantially flat outer and inner walls. Referring to FIG. 4B, the second blocking layer 43B of the second memory layer M2 may include a first protrusion 43_P1, may include a second protrusion 43_P2, or may include the first protrusion 43_P1 and the second protrusion 43_P2. The first protrusion 43_P1 may be located on an outer wall of the second blocking layer 43B, and the second protrusion 43_P2 may be located on an inner wall of the second blocking layer 43B. The first protrusion 43_P1 and the second protrusion 43_P2 may be located at substantially the same level. The second protrusion 43_P2 may protrude into the data storage layer 44, and the data storage layer 44 may have irregularities on an outer wall thereof.

Referring to FIG. 4C, an opening OP may include at least one notch NC that is located on a sidewall thereof. The notch NC may be located at an interface between the conductive layer 41 and the insulating layer 42. The notch NC may be caused by a difference in etching rates between stacked layers in the process of forming the opening OP. The notch NC may be filled with the third memory layer M3. The third blocking layer 43C may include a protrusion 43_P that is located in the notch NC.

FIG. 5A to 5D are diagrams for describing a manufacturing method of a semiconductor device in accordance with an embodiment. Hereinafter, the content overlapping with the previously described content will be omitted.

Figure 5A:
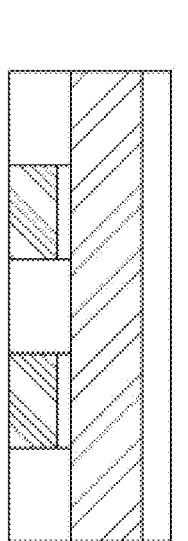
FIG. 5A to 5D are diagrams for describing a manufacturing method of a semiconductor device in accordance with an embodiment.
Figure 5A:
Figure 5A:
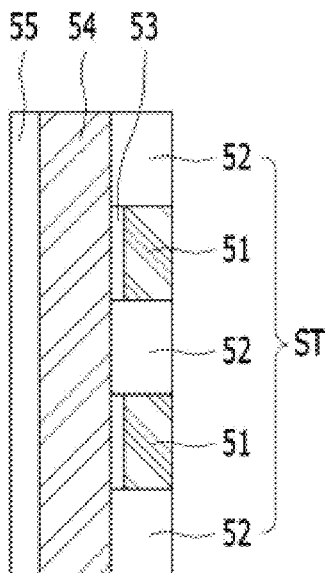

Referring to FIG. 5A, a stack ST may be formed. The stack ST may be formed on a lower structure, such as a source structure and a peripheral circuit. The stack ST may include first material layers 51 and second material layers 52 that are alternately stacked. The first material layers 51 may each include a material having a high etching selectivity with respect to the second material layers 52. For example, the first material layers 51 may each include a sacrificial material, such as nitride, and the second material layers 52 may each include an insulating material, such as oxide. In another example, the first material layers 51 may each include a conductive material, such as polysilicon, tungsten, or molybdenum, and the second material layers 52 may each include an insulating material, such as oxide.

Subsequently, an opening OP may be formed in the stack ST. The opening OP may have a shape, such as a circle, an ellipse, or a polygon in plan view. However, due to process limitations, at least a part of the opening OP may have an abnormal profile. In an embodiment, the opening OP may have a shape in which at least a part of a circular shape is distorted in plan view or may include at least one notch in a sidewall thereof.

In the process of forming the opening OP, oxide layers 53 may be formed on the first material layers 51 that are exposed into the opening OP. In an embodiment, the oxide layers 53 may be native oxide layers. The native oxide layer may be formed in an etching process for forming the opening OP or in a process of stripping a mask pattern (not illustrated) that is used to form the opening OP. The oxide layers 53 may be located between the second material layers 52. Sidewalls of the oxide layers 53 may be aligned with sidewalls of the second material layers 52 or may protrude into the opening OP compared to the sidewalls of the second material layers 52.

Subsequently, a seed layer 54 may be formed in the opening OP. The seed layer 54 may be used to form a blocking layer and may include nitrogen with a relatively low concentration. In an embodiment, the seed layer 54 may include nitrogen with a lower concentration than silicon nitride and may include silicon oxynitride. Since the seed layer 54 with a lower nitrogen concentration than a nitride layer is used, step coverage may be improved and oxidation degradation that is caused by loading degradation may be improved.

The seed layer 54 may be formed along an inner surface of the opening OP. The seed layer 54 may be formed through a deposition method, such as atomic layer deposition (ALD). When the opening OP has an abnormal profile, the seed layer 54 may also have a profile corresponding to the abnormal profile. When the oxide layers 53 protrude into the opening OP to form an uneven profile, the seed layer 54 may be formed along the uneven profile. When the opening OP includes a notch in a sidewall thereof, the seed layer 54 may be formed in the notch.

Subsequently, a buffer layer 55 may be formed by surface-treating the seed layer 54. The buffer layer 55 may be formed by oxidizing the surface of the seed layer 54 by a certain thickness. After the seed layer 54 is formed, the buffer layer 55 may be formed in-situ. The buffer layer 55 may be a first oxide layer and may include silicon oxide. The surface of the seed layer 54 may be oxidized by radical oxidation, and OH radicals may be used. In an embodiment, after a silicon oxynitride layer (SiON) is deposited, a silicon oxide layer (SiO$_2$) may be formed through OH radical oxidation at a low pressure in a batch.

By forming the buffer layer 55, the surface of the seed layer 54 may be cured. By the curing process using radicals, impurities on the surface of the seed layer 54 may be removed through a slow reaction, and the layer quality of a blocking layer to be formed in a subsequent process may be improved.

Figure 5B:
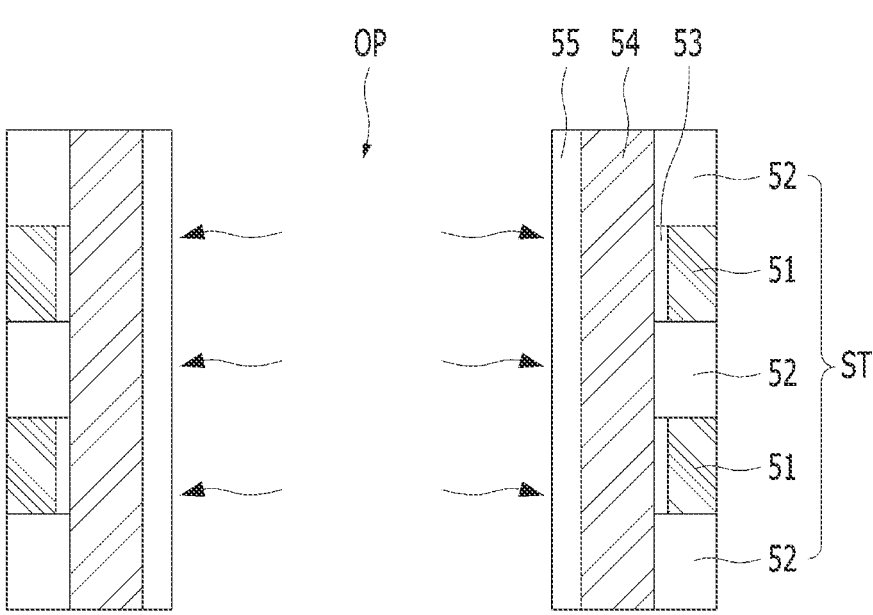
Figure 5C:
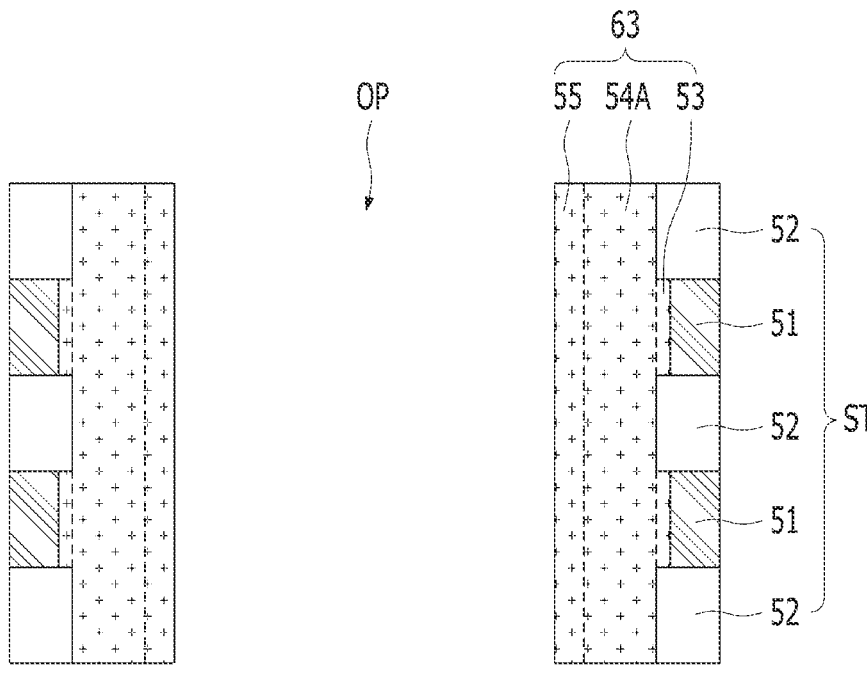

Referring to FIG. 5B and FIG. 5C, a blocking layer 63 may be formed by oxidizing the seed layer 54 through the buffer layer 55. After the buffer layer 55 is formed, the blocking layer 63 may be formed in-situ. The seed layer 54 may be oxidized by radical oxidation, and OH radicals may be used.

In an embodiment, a second oxide layer 54A may be formed by oxidizing the seed layer 54 through the buffer layer 55, and the second oxide layer 54A may be used as the blocking layer 63. Alternatively, the buffer layer 55 (first oxide layer) and the oxide layer 53 may be used as the blocking layer 63, together with the second oxide layer 54A. In the process of oxidizing the seed layer 54, the buffer layer 55 or the oxide layer 53 may be additionally oxidized. The blocking layer 63 may include at least one protrusion on an outer wall or an inner wall thereof.

When the blocking layer 63 is formed through the oxidation process, the seed layer 54 may expand during the oxidation process, which may cause tensile stress and wafer warpage. Accordingly, a volume expansion rate may be adjusted by adjusting the nitrogen concentration of the seed layer 54. By forming the seed layer 54 using a material having a lower nitrogen concentration than a silicon nitride layer, volume expansion may be reduced, and tensile stress and wafer warpage may be reduced. By reducing trap sites due to the relatively lower nitrogen concentration in the blocking layer 63, charge loss may be reduced.

Furthermore, by forming the seed layer 54 using a material having a lower nitrogen concentration than a silicon nitride layer, oxidizing power may be increased compared to a nitride layer. Radicals may be sufficiently supplied up to a lower portion of the opening OP having a large aspect ratio, and the seed layer 54 may be uniformly oxidized. Less oxidization of the seed layer 54 that is formed below the opening OP or charge loss due to trap sites may be minimized or prevented. Even though the opening OP includes a notch, the seed layer 54 in the notch may be sufficiently oxidized and the seed layer 54 may not be remained or less remained in the notch.

Figure 5D:
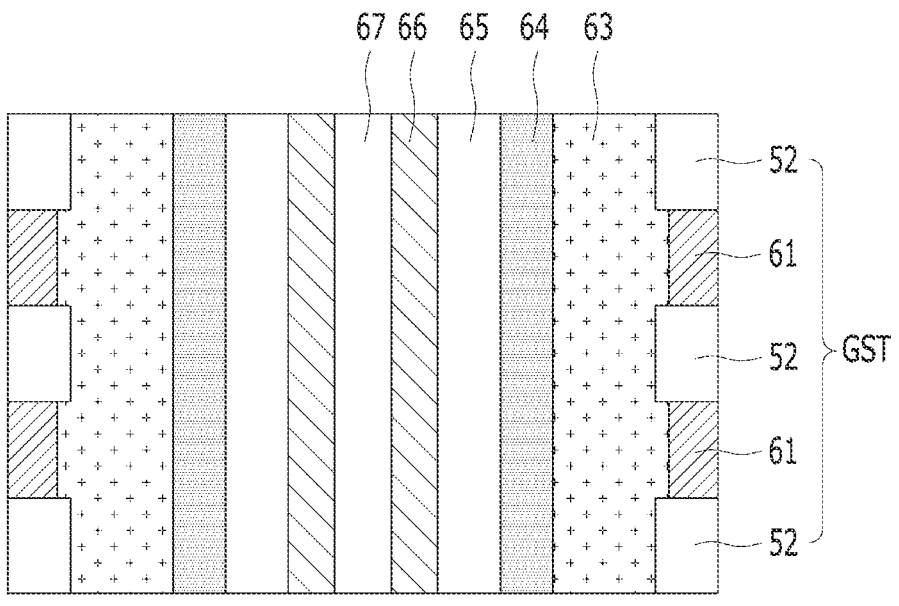

Referring to FIG. 5D, a data storage layer 64 may be formed in the blocking layer 63. The data storage layer 64 may be formed along an inner surface of the blocking layer 63, and the profile of the blocking layer 63 may be transferred to the data storage layer 64. The data storage layer 64 may include irregularities on an outer wall thereof or have an abnormal profile that is transferred from the opening OP. A tunneling layer 65 may be formed in the data storage layer 64. Subsequently, a channel layer 66 may be formed in the tunneling layer 65. Subsequently, an insulating core 67 may be formed in the channel layer 66. The tunneling layer 65, the channel layer 66, or the insulating core 67 may have an abnormal profile that is transferred from the opening OP. For reference, a vertical electrode may also be formed instead of the channel layer 66.

Subsequently, the first material layers 51 may be replaced with third material layers 61. In an embodiment, the third material layers 61 may be formed after forming a slit that passes through the stack ST and removing the first material layers 51 through the slit. The third material layers 61 may each include a metal, such as tungsten or molybdenum. Accordingly, a gate structure GST including the second material layers 52 and the third material layers 61 that are alternately stacked may be formed. For reference, when each of the first material layers 51 includes a conductive material, such as polysilicon or metal, the first material layers 51 may be used as the third material layers 61. In such a case, a silicidation process for reducing the resistance of the first material layers 51 may be additionally performed.

According to the manufacturing method described above, the surface of the seed layer 54 may be cured by forming the buffer layer 55, and the seed layer 54 may be indirectly oxidized through the buffer layer 55. Accordingly, the layer quality of the blocking layer 63 may be improved, and wafer warpage may be reduced. Furthermore, compared to a method of forming a blocking layer through the repeating of deposition and oxidation of a seed layer, the manufacturing cost may be reduced.

Figure 6A:
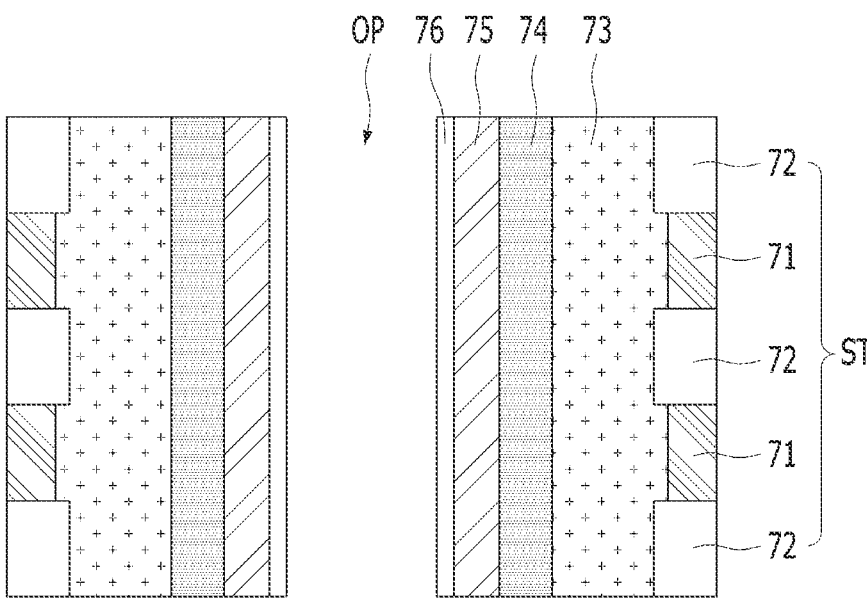
FIG. 6A and FIG. 6B are diagrams for describing a manufacturing method of a semiconductor device in accordance with an embodiment.
Figure 6B:
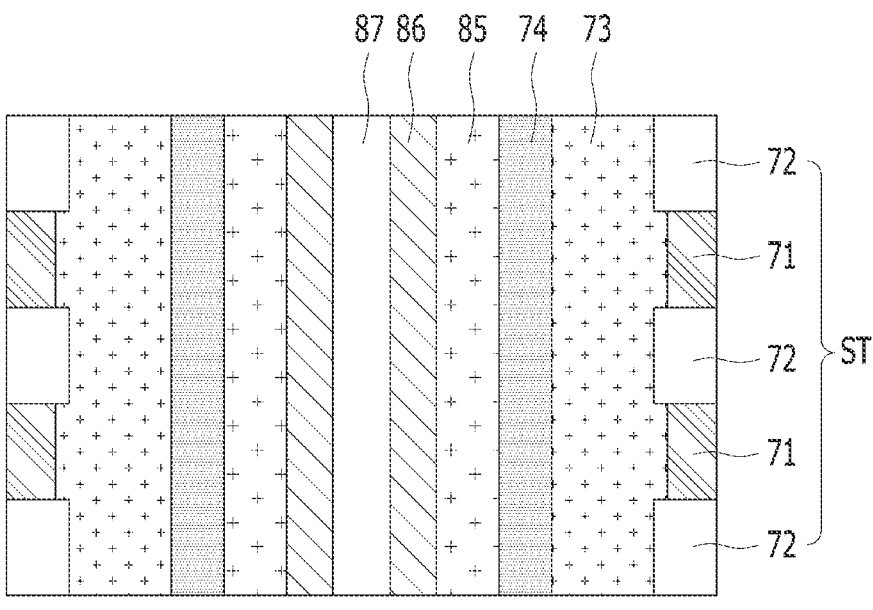

FIG. 6A and FIG. 6B are diagrams for describing a manufacturing method of a semiconductor device in accordance with an embodiment. Hereinafter, the content overlapping with the previously described content will be omitted.

Referring to FIG. 6A, a stack ST may be formed. The stack ST may include first material layers 71 and second material layers 72 that are alternately stacked. Subsequently, an opening OP may be formed in the stack ST. At least a part of the opening OP may have an abnormal profile.

Subsequently, a blocking layer 73 may be formed in the opening OP. In an embodiment, a tunneling layer may be formed by forming a seed layer in the opening OP, forming a buffer layer on the seed layer, and then oxidizing the seed layer through the buffer layer. The seed layer may include a material having a lower nitrogen concentration than a silicon nitride layer and may include a silicon oxynitride layer. Subsequently, a data storage layer 74 may be formed in the blocking layer 73.

Subsequently, a seed layer 75 may be formed in the data storage layer 74. The seed layer 75 may be used to form a tunneling layer and may include nitrogen with a relatively low concentration. In an embodiment, the seed layer 75 may include nitrogen with a lower concentration than silicon nitride and may include silicon oxynitride.

Subsequently, a buffer layer 76 may be formed by surface-treating the seed layer 75. After the seed layer 75 is formed, the buffer layer 76 may be formed in-situ. The buffer layer 76 may include silicon oxide. The buffer layer 76 may be formed by oxidizing the surface of the seed layer 75 by a certain thickness. In an embodiment, the surface of the seed layer 75 may be oxidized by radical oxidation, and OH radicals may be used.

Referring to FIG. 6B, a tunneling layer 85 may be formed by oxidizing the seed layer 75 through the buffer layer 76. The buffer layer 76 may be used as the tunneling layer 85 together with a layer that is formed by oxidizing the seed layer 75. By forming the seed layer 75 using a material having a lower nitrogen concentration than a silicon nitride layer, volume expansion may be reduced in the oxidation process, and tensile stress and wafer warpage may be reduced. By reducing trap sites due to the relatively lower nitrogen concentration in the tunneling layer 85, charge loss may be reduced. Furthermore, radicals may be sufficiently supplied up to a lower portion of the opening OP, and less oxidization of the seed layer 75 that is formed below the opening OP or charge loss due to trap sites may be minimized or prevented.

Subsequently, a channel layer 86 may be formed in the tunneling layer 85, and an insulating core 87 may be formed in the channel layer 86. The blocking layer 73, the data storage layer 74, the tunneling layer 85, the channel layer 86, or the insulating core 87 may have an abnormal profile that is transferred from the opening OP. Subsequently, a subsequent process, such as replacing the first material layers 71 with third material layers, may be performed.

According to the manufacturing method described above, the surface of the seed layer 75 may be cured by forming the buffer layer 76, and the seed layer 75 may be indirectly oxidized through the buffer layer 76. Accordingly, the layer quality of the tunneling layer 85 may be improved and wafer warpage may be reduced. Furthermore, compared to a method of forming a tunneling layer by repeating a process of depositing and oxidizing a seed layer, the manufacturing cost may be reduced.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A manufacturing method of a semiconductor device, the manufacturing method comprising:
  forming a stack comprising first material layers and second material layers that are alternately stacked;
  forming an opening in the stack;
  forming a first seed layer in the opening;
  forming a first buffer layer by surface-treating the first seed layer; and
  forming a blocking layer by oxidizing the first seed layer through the first buffer layer.

2. The manufacturing method of claim 1, wherein the first seed layer comprises a material having a lower nitrogen concentration than silicon nitride.

3. The manufacturing method of claim 1, wherein the first seed layer includes silicon oxynitride.

4. The manufacturing method of claim 1, wherein, in the forming of the first seed layer, the first seed layer is formed using atomic layer deposition (ALD).

5. The manufacturing method of claim 1, wherein, in the forming of the first buffer layer, the surface of the first seed layer is oxidized using OH radicals.

6. The manufacturing method of claim 1, wherein the first buffer layer includes silicon oxide.

7. The manufacturing method of claim 1, wherein the first buffer layer is formed in-situ.

8. The manufacturing method of claim 1, wherein the opening has an abnormal profile.

9. The manufacturing method of claim 1, wherein, in the forming of the blocking layer, the first seed layer is oxidized and expanded.

10. The manufacturing method of claim 1, further comprising:
  forming a data storage layer along an inner surface of the blocking layer;
  forming a tunneling layer along an inner surface of the data storage layer; and
  forming a channel layer along an inner surface of the tunneling layer.

11. The manufacturing method of claim 10, wherein the forming of the tunneling layer comprises:
  forming a second seed layer along the inner surface of the data storage layer;
  forming a second buffer layer by surface-treating the second seed layer; and
  forming the tunneling layer by oxidizing the second seed layer through the second buffer layer.

12. The manufacturing method of claim 11, wherein, in the forming of the second buffer layer, the surface of the second seed layer is oxidized using OH radicals.

13. A manufacturing method of a semiconductor device, the manufacturing method comprising:
  forming a stack comprising first material layers and second material layers that are alternately stacked;
  forming an opening in the stack;
  forming a silicon oxynitride layer in the opening;
  forming a first oxide layer by surface-treating the silicon oxynitride layer;
  forming a second oxide layer by oxidizing the silicon oxynitride layer through the first oxide layer; and
  forming a channel layer along an inner surface of the second oxide layer.

14. The manufacturing method of claim 13, wherein, in the forming of the first oxide layer, the surface of the silicon oxynitride layer is oxidized using OH radicals.

15. The manufacturing method of claim 13, further comprising:
  forming a data storage layer along an inner surface of the second oxide layer; and
  forming a tunneling layer along an inner surface of the data storage layer.

16. The manufacturing method of claim 13, further comprising:
  forming a blocking layer along an inner surface of the opening; and
  forming a data storage layer along an inner surface of the blocking layer.

* * * * *